United States Patent [19]

Furuya et al.

[11] 3,794,924

[45] Feb. 26, 1974

[54] MULTI-CHANNEL WAVE RECEIVER

[75] Inventors: Shigeo Furuya, Tokyo; Koji Ouchi, Kanagawa-ken, both of Japan

[73] Assignee: Sony Corporation, Tokyo, Japan

[22] Filed: June 12, 1972

[21] Appl. No.: 262,155

[30] Foreign Application Priority Data

June 17, 1971 Japan .............................. 46/43745

[52] U.S. Cl. ................ 325/439, 325/459, 325/464, 325/488, 334/15

[51] Int. Cl. ............................................ H04b 1/16

[58] Field of Search ... 325/439, 440, 452, 458, 459, 325/461, 464, 465, 468, 490, 488; 334/15

[56] References Cited

UNITED STATES PATENTS

| | | | |
|---|---|---|---|
| 3,528,044 | 9/1970 | Manicki | 325/459 X |
| 3,354,397 | 11/1967 | Wittig | 325/459 |
| 2,997,579 | 8/1961 | Murakami et al. | 325/439 |
| 3,611,154 | 10/1971 | Kupfer | 325/459 |

*Primary Examiner*—Benedict V. Safourek
*Attorney, Agent, or Firm*—Hill, Sherman, Meroni, Gross & Simpson

[57] ABSTRACT

A television signal receiving circuit having a solid state VHF and UHF tuner. The VHF tuner includes a number of resonant circuits and solid state switching means to switch between low and high bands within the VHF frequency range. The UHF tuner is coupled directly to an input of the mixer associated with the VHF tuner. The local oscillator associated with the VHF tuner has two means for injecting the oscillator voltage into the mixer. One of the injection means operates only on high frequency band and is controlled by a switching diode. The various resonant circuits of the VHF tuner utilize dumping impedances which are switched in and out of operation in order to equalize the resonant gain between low and high frequency band operation.

3 Claims, 3 Drawing Figures

MULTI-CHANNEL WAVE RECEIVER

BACKGROUND OF THE INVENTION

1. Description of the Prior Art

Solid state VHF and UHF tuners are known in the prior art where the VHF tuner has a low and a high frequency band controlled by common tuning voltage source. Such tuners are shown for example in U.S. Pat. No. 3,528,044, however, the prior art does not solve the problem of interference between the UHF intermediate frequency signal and the VHF tuner. Also, the prior art has not been able to couple the UHF tuner directly to the input of the mixer circuit, since the output impedance of the UHF tuner interferes with the frequency response of the VHF tuner. In addition, the prior art has not been able to obtain a constant Q for tuning throughout the VHF band. Also, with the prior art circuits it is difficult to obtain a constant level of oscillator injection signal throughout the VHF band.

2. Field of the Invention

The field of art to which this invention pertains is solid state VHF and UHF tuners and circuit means associated therewith.

SUMMARY OF THE INVENTION

It is an important feature of the present invention to provide an improved solid state VHF-UHF tuner for a television receiver.

It is another feature of the present invention to provide a television tuner which solves many of the disadvantages of prior art solid state tuners.

It is a principal object of the present invention to provide a tuner circuit for a television receiver wherein the UHF output is coupled directly to the mixer associated with the VHF tuner.

It is another object of the present invention to provide a VHF tuner for a television receiver wherein the resonant circuits therein have a constant Q for both the low and high band portions of the VHF band.

It is also an object of the invention to provide a VHF tuner having two means for injecting a local oscillator signal into the VHF mixer wherein the second injection means is utilized only during the high band portion of the VHF band.

These and other objects, features and advantages of the present invention will be understood in greater detail from the following description and the associated drawings wherein reference numerals are utilized to designate a preferred embodiment.

DESCRIPTION OF THE PREFERRED EMBODIMENT

Figure 1:
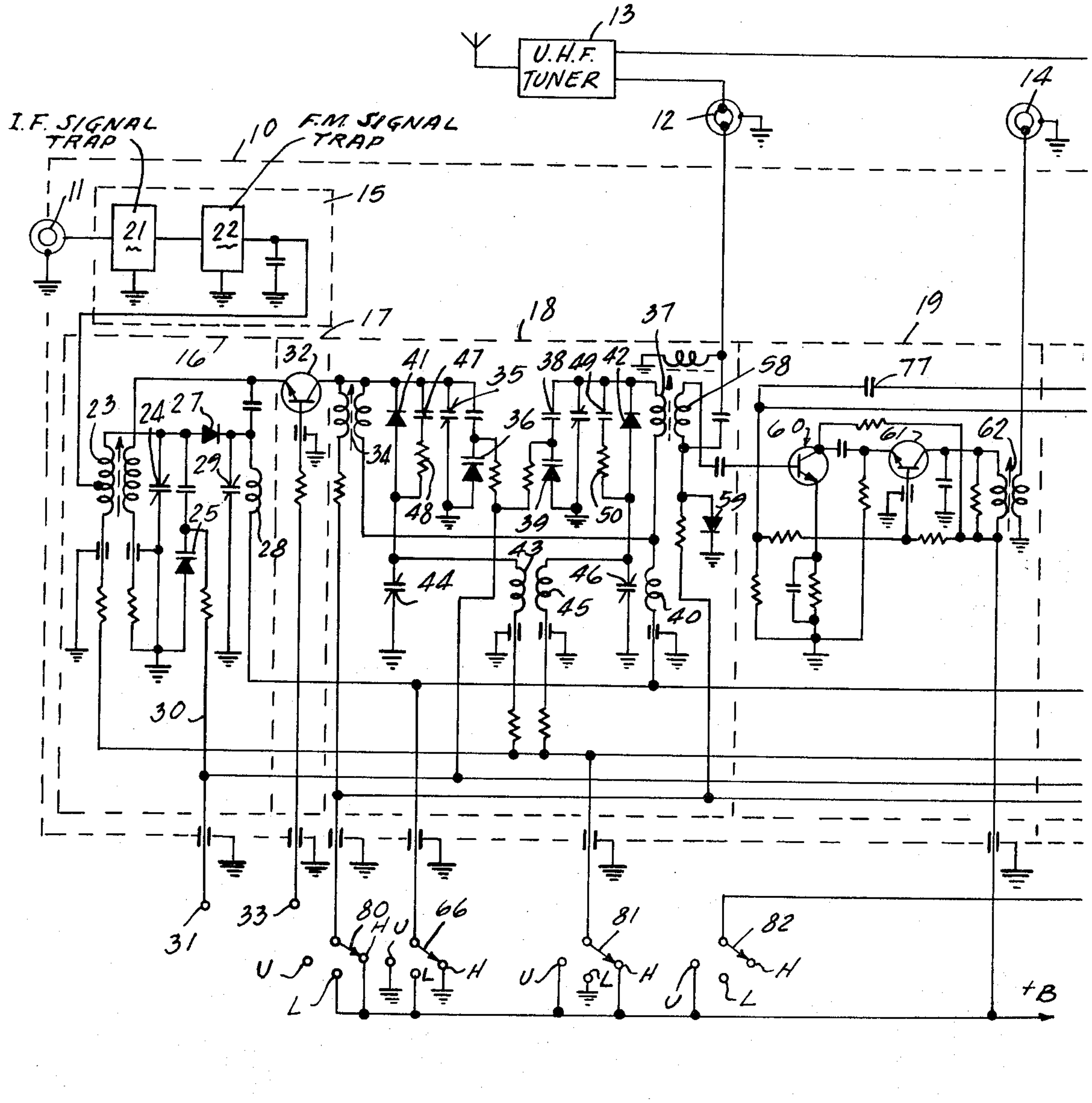
FIGS. 1 and 2 together represent a schematic of the circuit of the present invention.
Figure 2:
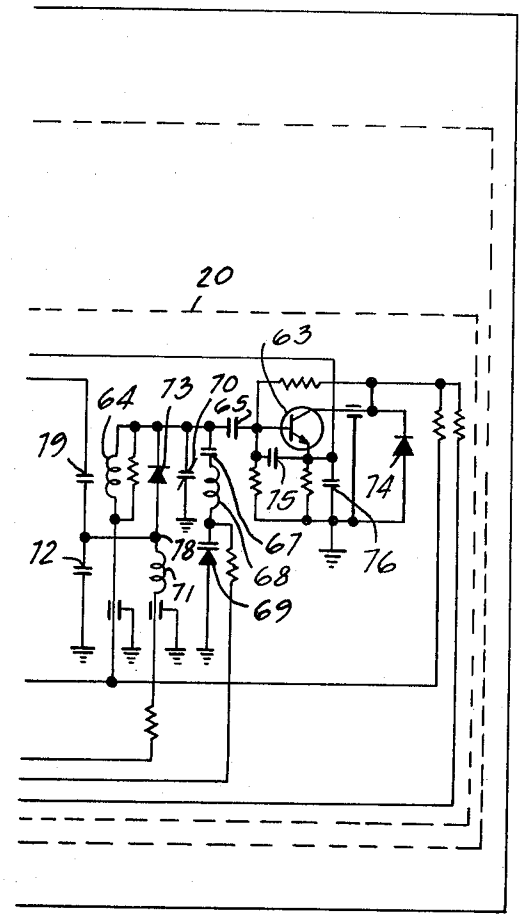

The schematic shown in FIGS. 1 and 2 illustrate all the circuit features of the present invention. Referring to the drawings, and in particular to FIGS. 1 and 2, a shield which surrounds the VHF tuner is indicated by the reference numeral 10. A VHF antenna is connected to a jack 11. A jack 12 provides an IF output for a UHF tuner 13. Also, a jack 14 provides the output for the VHF tuner.

The VHF tuner includes a filter circuit 15, a tunable preselector input circuit 16, an RF amplifier circuit 17, an RF signal tuning circuit 18, a mixer circuit 19 and a local oscillator 20.

The filter circuit 15 includes an IF signal trap circuit 21 and an FM signal trap circuit 22 so that spurious radiation from the VHF tuner is eliminated.

Referring to the tunable preselector circuit 16, an RF transformer 23, a trimmer capacitor 24 and a variable capacitance diode (varactor) 25 comprises a low frequency band tuning circuit to receive, for instance, Channels 2 through 6.

By forward biasing a switching diode 27, a parallel circuit of a coil 28 and a trimmer capacitor 29 is connected in parallel with the trimmer capacitor 24 to form a high frequency tuning band for reception of Channels 7 through 13. The tuning voltage is coupled to the cathode of the varactor 25 through a circuit line 30. This same circuit line controls the other varactors from a common tuning voltage source 31.

The RF amplifier circuit 17 includes a transistor 32 which is connected in a grounded base configuration. An AGC signal is coupled to the base from an AGC circuit point 33.

The RF signal tuning circuit 15 has a double tuning circuit. An RF transformer, a trimmer capacitor 35 and a varactor 36 comprise a first low frequency band tuning circuit, and a further RF transformer 37, a trimmer capacitor 38 and a varactor 39 comprise a second low frequency band tuning circuit. First and second circuits are coupled together by means of a coil 40 to form the double tuning circuit at the low frequency band.

Switching diodes 41 and 42 are provided to switch between the low and high bands.

If the switching diodes 41 and 42 are forward biased, a coil 43 and a trimmer capacitor 44 are connected in parallel with the trimmer capacitor 35. Also, a coil 45 and a trimmer capacitor 46 are connected in parallel with the trimmer capacitor 38. The coils 43 and 45 are coupled together electromagnetically to form a double tuning circuit at the high band.

According to the present invention a high-pass capacitor 47 and a resistor 48 are connected in parallel with the switching diode 41 and a similar circuit including a capacitor 49 and a resistor 50 are connected in parallel with the switching diode 42. If the switching diodes 41 and 42 are reversed biased, the first and second series circuits serve as a dumping impedance respectively.

Figure 3:
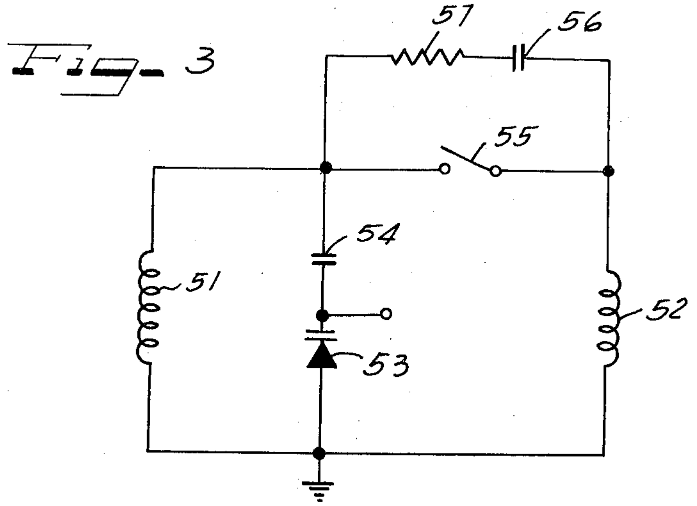
FIG. 3 is an equivalent circuit of a portion of the circuit shown in FIGS. 1 and 2.

In FIG. 3, there is shown an equivalent circuit of the portions shown in FIGS. 1 and 2. In FIG. 3, a coil 51 is the equivalent of the transformer 34, and a coil 52 is the equivalent of the coil 43. A varactor diode 53 would be the varactor diode 36 of FIG. 1. A DC block capacitor 54 is provided.

In FIG. 3, the switching diode 41 is replaced by a switch 55, and the parallel branch which includes the series elements 47 and 48 are replaced by the elements 56 and 57 in FIG. 3.

It can be seen from studying FIG. 3 that the resistor 57 serves as a dumping resistor only when the switch 55 is open. The purpose of this arrangement is to provide a substantially constant gain for both conditions when the switch 55 is closed or open. The result is that the gain of the circuit is substantially constant in both the low frequency band and the high frequency band operation.

Referring again to FIGS. 1 and 2, an IF signal from the UHF tuner is connected to one end of a secondary coil 58 of the transformer 37 and is grounded through a switching diode 59. The other end of the coil 58 is connected directly to the mixer 19.

The mixer 19 includes a cascade amplifier having an emitter-grounded transistor 60 and a base-grounded transistor 61. The transistor 61 is connected to an IFT transformer 62. The mixer circuit serves not only as a mixer when the oscillator signal is applied from the local oscillator, but it also serves as an amplifier when the oscillator signal is not applied and the UHF intermediate frequency signal from the tuner 13 is applied as explained.

The switching diode 59 is forward biased during VHF reception to shunt the output impedance of the UHF tuner. In the past a switch would have been necessary to isolate the UHF tuner from the VHF tuner.

The local oscillator 20 is a Colpitts oscillator including a transistor 63. One end of a coil 64 is connected to the base of the transistor 63 through a capacitor 65, and the other end of the coil is grounded through a switch 66. 'A series circuit of a capacitor 67, a coil 68, a varactor diode 69 and a trimmer capacitor 70 is connected in parallel with the coil 64 to provide a resonant circuit at the low frequency band. A parallel circuit of a coil 71 and a trimmer capacitor 72 is connected to one end of the coil 64 through a switching diode 73 which is forward biased during high frequency band reception. A zener diode 74 is connected between the collector of the transistor 63 and ground to supply a stable voltage to bias the transistor 63. A capacitor 75 is connected between the base and emitter of the transistor 63 and the emitter is grounded through a capacitor 76.

The oscillator signal is applied to the mixer 19 from the emitter of the transistor 63 through a capacitor 77 to the base of the transistor 60 as shown.

In the present invention, a second loop is provided for injecting the oscillator voltage to the mixer. This second loop is provided from the connection point of the switching diode 73 and the coil 71. This point is identified by the reference numeral 78. The oscillator voltage connected at this point is coupled through a capacitor 79. The additional or secondary injection path through the capacitor 79 is only applied when the switching diode 73 is forward biased. This assures that the level of the oscillator signal to the mixer will be substantially constant throughout the low and high frequency bands.

The magnitude of the capacitance of the capacitor 77 is chosen to permit a suitable injection voltage at the low frequency band, while the capacitance of the capacitor 79 is selected to provide a high impedance at the low frequency band and a low impedance at the high frequency band. The oscillator signals can be applied to the mixer circuit from either the base or the emitter of the transistor 63.

Switches 80, 66, 81 and 82 are a ganged switch for selecting the low and high frequency bands of the VHF band and for selecting the UHF band.

The switch 80 supplies a source of B+ voltage to transistors 32 and 63, and the switching diode 59 at low and high frequency bands.

The switch 66 operates to forwardly bias the switching diodes 27, 41, 42, and 73 at the high frequency band and the UHF band in conjunction with the switch 81.

At the low frequency band the switching diodes 27, 41, 42 and 73 are desired to be reverse biased with a stabilize voltage from the collector of transistor 63, whereby the switching diodes are completely nonconductive regardless of any variation in the B+ voltage source.

The switch 82 is for operating the UHF tuner 13 at the UHF band.

As explained, at each frequency band, a tuning voltage is applied to the terminal 31 in a well understood manner. Therefore, even when in the UHF band, the predetermined tuning voltage is always applied to the varactor diodes 25, 36, 39, and 69. In such a case, the RF signal tuning circuit 18 is operative even though the B+ source is not supplied to the RF amplifier and local oscillator circuits.

A video IF frequency of the UHF tuner 13 is very close to the frequency band of Channel 2. Therefore, the UHF tuner output signal is partially by-passed through the RF signal tuning circuit 18 to reduce the frequency response of the mixer 16 when it is used only as an amplifier if at least switching diodes 41 and 42 are not forward biased. Since the UHF band switching and the reverse biasing of the diodes 27, 41, 42, and 73 is accomplished through the switches 66 and 81, an amplified UHF signal is obtained at the jack 14 without distortion.

We claim:

1. A television signal receiving circuit comprising: a VHF tuner including a first resonant circuit, means for coupling an RF signal to said first resonant circuit, an RF amplifier circuit coupled to an output of said first resonant circuit, a second resonant circuit coupled to an output of said RF amplifier circuit, a mixer, an oscillator having a third resonant circuit, means for supplying the outputs of said oscillator and said second resonant circuit to said mixer, a UHF tuner having an IF output coupled to said mixer, each of said resonant circuits having a variable capacitance with means for coupling a tuning voltage thereto, means within each of said resonant circuits for switching between a low and a high frequency band, wherein said means for switching between a low and a high band comprises a switching diode, first and second portions of said resonant circuit being coupled and decoupled by said switching diode, and an impedance connected to the output of said UHF tuner, a diode in shunt with said impedance, and means for forward biasing said diode during VHF reception to isolate the UHF tuner from the VHF tuner.

2. In a television receiver, a mixer for converting an RF signal into an IF signal, a local oscillator, said local oscillator having a resonant circuit means, said oscillator having a variable capacitance and switching means for tuning said resonant circuit between a low and a high frequency band, means for coupling a first signal from said oscillator to said mixer independently of the state of said switching means, means for coupling a second signal from said oscillator to said mixer only when said switching means is in a predetermined state, a capacitor coupling said first signal to said mixer, said capacitor having a value to pass said oscillator signal at said low frequency band, a further capacitor provided to couple the second signal to the mixer and wherein said further capacitor is sufficiently small to provide a large impedance at the low band frequency and a small impedance at the high band frequency.

3. A television receiving circuit for a VHF-UHF receiver comprising: a VHF filter circuit receiving the VHF signal, a tunable preselector having a tunable circuit receiving the output of said VHF filter circuit, a first voltage variable capacitor in said tunable circuit of said preselector, a first switching diode in said tunable preselector and forward biased at the high frequency band of VHF and at the UHF frequency band, a first inductor and first capacitor connected in circuit when said first switching diode is forward biased, an RF amplifier receiving the output of said tunable preselector, an RF signal tuning circuit receiving the output of said RF amplifier and including first and second resonant circuits coupled together, a second voltage variable capacitor in said signal tuning circuit, a second switching diode in said first resonant circuit and forward biased at the high end of the VHF band, a second capacitor and a first resistor connected in series and across said second switching diode, a third voltage variable capacitor in said second resonant circuit, a third switching diode in said signal tuning circuit and forward biased at the high end of the VHF band, a third capacitor and a second resistor connected in series and across said third switching diode, a UHF tuner supplying an input to said signal tuning circuit, a fourth switching diode connected between ground and the input to said signal tuning circuit of said UHF tuner and forward biased during VHF operation, a mixer receiving the output of said signal tuning circuits, a local oscillator having a resonant circuit and supplying input to said mixer, a fourth voltage variable capacitor in said resonant circuit of said oscillator, a pair of output paths between said local oscillator and said mixer, and a fifth switching diode connected in one of said output paths of said local oscillator and forward biased at the high frequency end of the VHF band and at the UHF band.

* * * * *